United States Patent
Huang et al.

(10) Patent No.: US 9,450,183 B2
(45) Date of Patent: Sep. 20, 2016

(54) MEMORY STRUCTURE HAVING TOP ELECTRODE WITH PROTRUSION

(71) Applicant: Taiwan Semiconductor Manufacturing Co., Ltd., Hsin-Chu (TW)

(72) Inventors: Jian-Shiou Huang, Pingtung County (TW); Yao-Wen Chang, Taipei (TW); Hsing-Lien Lin, Hsin-Chu (TW); Cheng-Yuan Tsai, Hsin-Chu County (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/457,170

(22) Filed: Aug. 12, 2014

(65) Prior Publication Data

US 2016/0049583 A1    Feb. 18, 2016

(51) Int. Cl.
*H01L 47/00*    (2006.01)
*H01L 45/00*    (2006.01)

(52) U.S. Cl.
CPC .......... *H01L 45/1273* (2013.01); *H01L 45/08* (2013.01); *H01L 45/1608* (2013.01); *H01L 45/1666* (2013.01)

(58) Field of Classification Search
USPC ........ 257/2–5, E31.029, E31.03; 438/95, 96, 438/382, 102, 593, 782
See application file for complete search history.

(56) References Cited

U.S. PATENT DOCUMENTS

| | | | | |
|---|---|---|---|---|
| 5,166,758 A | * | 11/1992 | Ovshinsky | G11C 11/56 257/3 |
| 2006/0027893 A1 | * | 2/2006 | Meijer | H01L 27/20 257/536 |
| 2012/0252184 A1 | * | 10/2012 | Ninomiya | C23C 26/00 438/382 |

OTHER PUBLICATIONS

Jung Ho Yoon, et al.; "Highly Improved Uniformity in the Resistive Switching Parameters of TiO2 Thin Films by Inserting Ru Nanodots"; Advanced Materials, 2013, 25, p. 1987-1992.
Zhiping Zhang, et al.; "Nanometer-Scale HfOx RRAM"; IEEE Electron Device Letters, vol. 34, No. 8, Aug. 2013, p. 1005-1007.

* cited by examiner

*Primary Examiner* — Dao H Nguyen
*Assistant Examiner* — Tram H Nguyen
(74) *Attorney, Agent, or Firm* — Eschweiler & Associates, LLC

(57) ABSTRACT

The present disclosure relates to an RRAM (resistive random access memory) cell having a top electrode with a geometry configured to improve the electric performance of the RRAM cell, and an associated method of formation. In some embodiments, the RRAM cell has a lower insulating layer with a micro-trench located over a lower metal interconnect layer disposed within a lower inter-level dielectric (ILD) layer that overlies a semiconductor substrate. A bottom electrode is disposed over the micro-trench, and a dielectric data storage layer is located over the bottom electrode. A top electrode is disposed over the dielectric data storage layer. The top electrode has a protrusion that extends outward from a bottom surface of the top electrode at a position overlying the micro-trench. The protrusion generates a region having an enhanced electric field within the dielectric data storage layer, which improves performance of the RRAM cell.

20 Claims, 7 Drawing Sheets

US 9,450,183 B2

MEMORY STRUCTURE HAVING TOP ELECTRODE WITH PROTRUSION

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology due to its simple structure and its compatibility with CMOS logic fabrication processes. An RRAM cell includes a resistive data storage layer vertically located between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
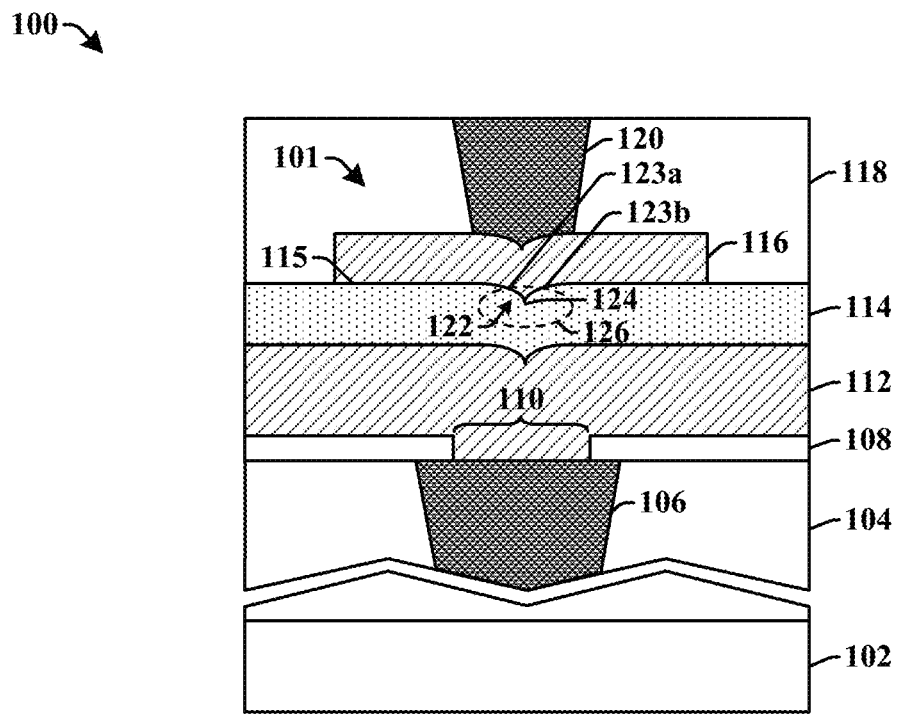
FIG. 1 illustrates a cross-sectional view of some embodiments of an integrated chip having an RRAM (resistive random access memory) cell comprising a top electrode having a sharp tip geometry.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells have a bottom electrode that is separated from an overlying top electrode by a dielectric data storage layer having a variable resistance. The bottom electrode may be formed by depositing a conductive material within a micro-trench located in a lower insulating layer disposed over a lower metal interconnect layer of a back-end-of-the-line (BEOL) metallization stack. A chemical mechanical polishing (CMP) process is then performed to planarize a top surface of the conductive material before the dielectric data storage layer and the top electrode are formed. The CMP process results in a dielectric data storage layer disposed between planar surfaces of the top and bottom electrodes.

As the size of RRAM cells decrease with scaling, electrical operating parameters of RRAM cells become smaller and associated operating tolerances become more stringent. Unfortunately, the formation of the top and bottom electrodes provide a resulting RRAM cell with a random distribution of electrical operating parameters, which strongly depend on a uniformity and a quality of the dielectric data storage layer. The random distribution of electrical operating parameters (e.g., voltages, current, and resistance states) may vary widely for RRAM cells formed by a same fabrication process, thereby causing reliability and electric performance issues.

Accordingly, the present disclosure relates to an RRAM cell having a top electrode with a geometry configured to improve the electric performance of the RRAM cell, and an associated method of formation. In some embodiments, the RRAM cell has a lower insulating layer with a micro-trench located over a lower metal interconnect layer disposed within a lower inter-level dielectric (ILD) layer that overlies a semiconductor substrate. A bottom electrode is disposed over the micro-trench, a dielectric data storage layer is located over the bottom electrode, and a top electrode is disposed over the dielectric data storage layer. The top electrode has a protrusion that extends outward from a non-planar bottom surface of the top electrode at a position overlying the micro-trench. The protrusion generates a region having an enhanced electric field within the dielectric data storage layer, which improves performance of the RRAM cell.

FIG. 1 illustrates a cross-sectional view of some embodiments of an integrated chip 100 having an RRAM (resistive random access memory) cell 101 comprising a top electrode 116 having a bottom protrusion with a sharp tip geometry.

RRAM cell 101 is disposed over a lower metal interconnect layer 106 surrounded by a lower inter-level dielectric (ILD) layer 104 of a back-end-of-the-line (BEOL) metallization stack overlying a semiconductor substrate 102. In some embodiments, a lower insulating layer 108 is located over opposing sides of the lower metal interconnect layer 106. The lower insulating layer 108 comprises a cavity or micro-trench 110 that extends through the lower insulating layer 108 to the underlying lower metal interconnect layer 106. A bottom electrode 112 is located over the lower metal interconnect layer 106 and the lower insulating layer 108. A dielectric data storage layer 114 having a variable resistance is located over the bottom electrode 112, and a top electrode 116 is positioned over the dielectric data storage layer 114. An overlying metal interconnect layer 120 (e.g., a via) surrounded by an upper ILD layer 118 is disposed onto the top electrode 116.

The top electrode 116 comprises a non-planar bottom surface 115 having a protrusion 122 with one or more corners that extend outward from the non-planar bottom surface 115 as positive reliefs overlying the micro-trench 110. The protrusion 122 comprises two adjacent edges, 123a and 123b, having different slopes that meet at a corner or point 124 disposed therebetween. In some embodiments, the protrusion 122 may have a sharp tip geometry that tapers to a point 124 comprising a nadir (i.e., a lowest point of the top electrode 116) disposed between adjacent edges, 123a and 123b, having concave surfaces.

During operation of the RRAM cell 101, a voltage applied to the top electrode 116 will generate an electric field that extends into the dielectric data storage layer 114. The electric field acts upon oxygen vacancies within the dielectric data storage layer 114, inducing conductive paths (e.g., comprising the oxygen vacancies) to form across the dielectric data storage layer 114. Depending on an applied voltage, the dielectric data storage layer 114 will undergo a reversible change between a high resistance state associated with a first data state (e.g., a '0') and a low resistance state associated with a second data state (e.g., a '1'). In a region 126 around the protrusion 122 electric field lines of the electric field will bunch, thereby causing a strength of the electric field in the region 126 to increase. The increase in the strength of the electric field due to the protrusion 122 will increase a distance that the electric field can move the oxygen vacancies within the dielectric data storage layer 114. By increasing a distance that the electric field can move oxygen radicals, the protrusion 122 is able to minimize non-uniformities of operating parameters of the RRAM cell 101 so as to improve performance of the RRAM cell 101.

Figure 2:
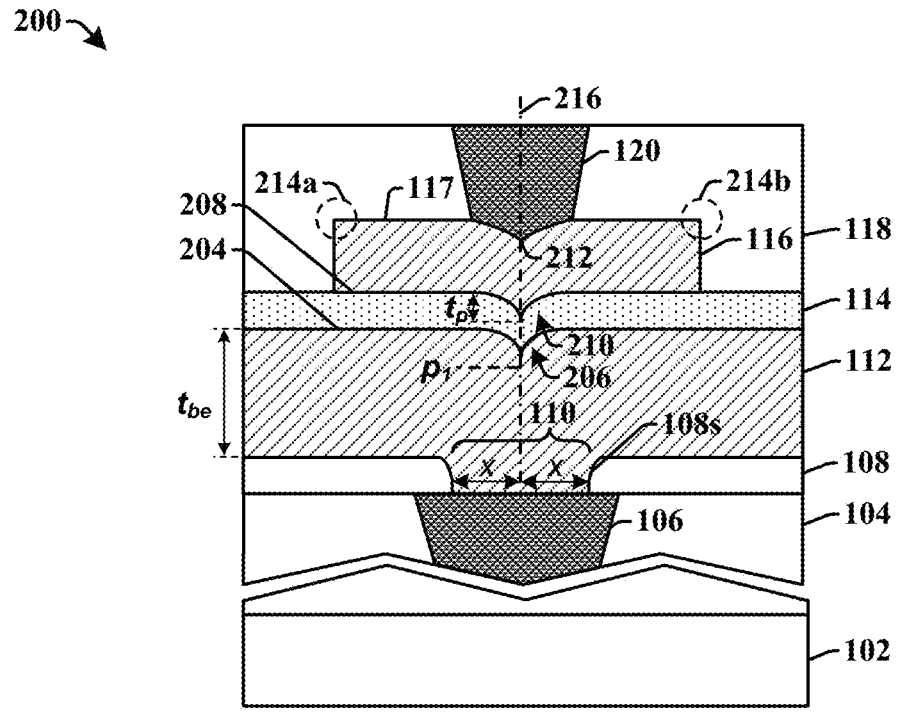
FIG. 2 illustrates a cross-sectional view of some additional embodiments of an integrated chip having an RRAM cell comprising a top electrode having a sharp tip geometry.

FIG. 2 illustrates a cross-sectional view of some additional embodiments of an integrated chip 200 having an RRAM cell 201 comprising a top electrode 116 having a sharp tip geometry.

The RRAM cell 201 comprises a lower insulating layer 108 located over opposing sides of a lower metal interconnect layer 106 disposed within a lower ILD layer 104. A cavity or micro-trench 110 extends through the insulating layer 108. In some embodiments, the micro-trench 110 may abut curved sidewalls 108s of the lower insulating layer 108 (i.e., sidewalls having a slope that changes as a function of height). A bottom electrode 112 is disposed over the micro-trench 110 and the lower insulating layer 108. In various embodiments, the bottom electrode 112 may have a first thickness $t_{be}$ that is in a range of between approximately 200 Å (angstroms) and approximately 1200 Å.

A dielectric data storage layer 114 is disposed onto the bottom electrode 112. In some embodiments, a bottom surface of dielectric data storage layer 114 continually abuts a top surface of bottom electrode along a first shared interface 204. The dielectric data storage layer 114 has a first protrusion 206 that extends outward from the first shared interface 204 to a position $p_1$ that is vertically within the bottom electrode 112. Since the first protrusion 206 extends to the position $p_1$ vertically within the bottom electrode 112, opposite sides of the first protrusion 206 abut the bottom electrode 112.

A top electrode 116 is disposed over the dielectric data storage layer 114. In some embodiments, a bottom surface of the top electrode 116 continually abuts top surface of the dielectric data storage layer 114 along a second shared interface 208. The top electrode 116 comprises a second protrusion 210 that extends outward from the second shared interface 208. In various embodiments, the second protrusion 210 may extend outward from the second shared interface 208 to a distance $t_p$ that is in a range of between approximately 100 Å and approximately 600 Å. In some embodiments, the second protrusion 210 has a same shape as the first protrusion 206, but has a smaller size (e.g., a smaller height and/or width). The second protrusion 210 causes a top surface 117 of the top electrode 116 to dip to a point 212 that is vertically disposed below upper outer corners, 214a and 214b, of the top surface 117 of the top electrode 116.

In some embodiments, the second protrusion 210 has a point 212 comprising a nadir (i.e., a lowest point of the top electrode 116) that is vertically aligned with a center of a micro-trench 202. For example, line 216 extends vertically through a center of the micro-trench 202 and through a point 212 comprising a nadir of the second protrusion 210. In some additional embodiments, the second protrusion 210 may have a point 212 comprising a nadir that is vertically aligned with a nadir of the first protrusion 206. In some embodiments, the second protrusion 210 has a shape is symmetric with respect to a normal line extending through a center of the micro-trench 202. For example, the second protrusion 210 may have a mirror image symmetry when reflected about the line 216 (i.e., line 216 divides the second protrusion 210 into two mutual mirror images).

Figure 3A:
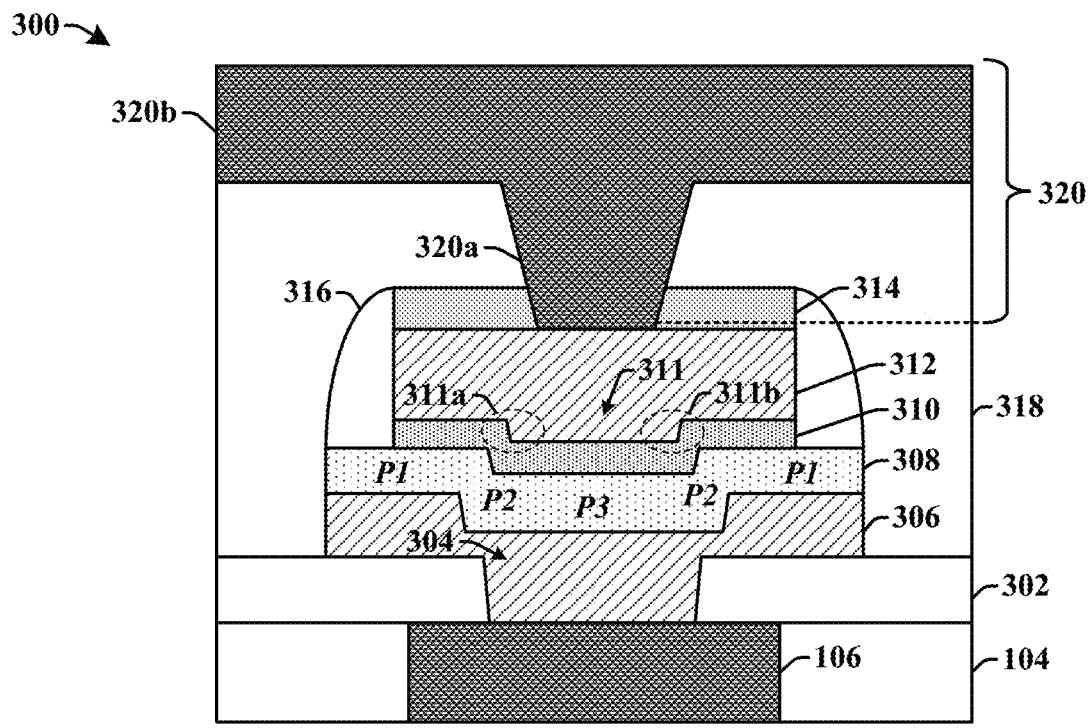
FIG. 3A-3B illustrates a cross-sectional view of some alternative embodiments of an RRAM cell comprising a top electrode having a sharp tip geometry.

FIG. 3A illustrates a cross-sectional view of some alternative embodiments of an RRAM cell 300 comprising a top electrode 312 having a sharp tip geometry.

The RRAM cell 300 comprises a bottom electrode 306 located over a lower insulating layer 302 that is disposed on opposing sides of a lower metal interconnect layer 106 surrounded by a lower ILD layer 104. The bottom electrode 306 comprises a conductive material (e.g., titanium, titanium nitride, tantalum, tantalum nitride, etc.) that vertically extends through a micro-trench 304 in the insulating layer 302. In some embodiments, a diffusion barrier layer (not shown) may be disposed between the bottom electrode 306 and the lower metal interconnect layer 106 and/or the lower insulating layer 302.

A high-k dielectric data storage layer 308 having a variable resistance is disposed over the bottom electrode 306. In various embodiments, the high-k dielectric data storage layer 308 may comprises a hafnium oxide (HfOx) nickel oxide (NiO$_x$), tantalum oxide (Ta$_y$O$_x$), titanium oxide (TiO$_x$), tungsten oxide (WO$_x$), zirconium oxide (ZrO$_x$), and/or other similar materials. In some embodiments, a capping layer 310 may be disposed onto the high-k dielectric data storage layer 308. The capping layer 310 is configured to store oxygen, which can facilitate resistance changes within the high-k dielectric data storage layer 308. In some embodiments, the capping layer 310 may comprise a metal or a metal oxide that is relatively low in oxygen concentration.

A top electrode 312, comprising a conductive material (e.g., titanium, titanium nitride, tantalum, tantalum nitride, etc.) is disposed onto the capping layer 310. An overlying masking layer 314 (e.g., a hard mask layer) may be disposed over the top electrode 312. In some embodiments, the masking layer 314 may comprise a silicon oxy-nitride (SiON) hard mask layer, a silicon dioxide (SiO$_2$) hard mask layer, or a PE-SiN hard mask. In some embodiments, sidewall spacers 316 are disposed on opposing sides of the capping layer 310, the top electrode 312, and the masking layer 314. An upper ILD layer 318 is disposed over the masking layer 314 at a position surrounding an upper metal interconnect layer 320 disposed onto the top electrode 312. The upper metal interconnect layer 320 comprises the upper metal via 320a, which extends through the masking layer 314 from the top electrode 312 to an upper metal wire 320b.

The top electrode 312 comprises a non-planar bottom surface having a protrusion 311 comprising a plurality of sharp corners, 311a and 311b, disposed between adjacent edges having different slopes. An electric field generated by the top electrode 312 (when a bias voltage is applied) in regions P2 around the sharp corners, 311a and 311b, is larger than in the electric field generated in other regions, P1 and P3, of the high-k dielectric data storage layer 308. The larger electric field causes oxygen vacancies within the high-k dielectric data storage layer 308 to be shifted by a greater distance, thereby increasing performance of the RRAM cell 300.

Figure 3B:
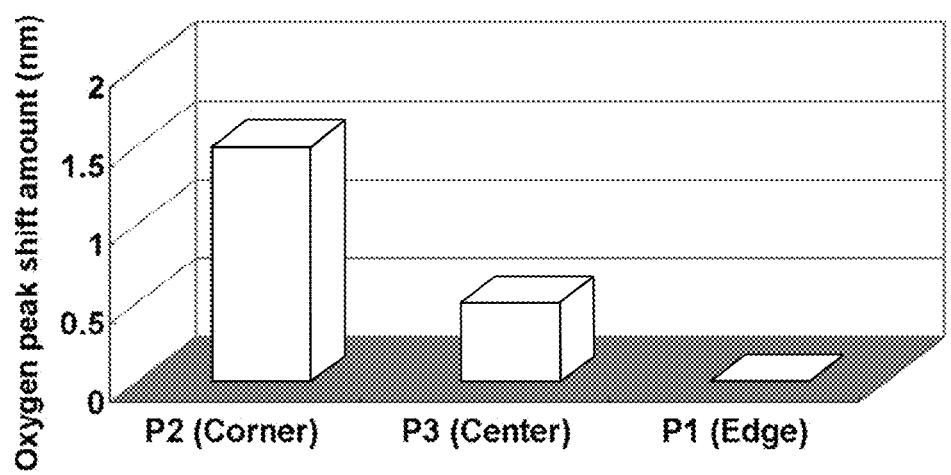

For example, FIG. 3B shows a bar graph 322 illustrating a peak shift amount of oxygen vacancies (e.g., measured by way of energy-dispersive x-ray spectroscopy) within the high-k dielectric data storage layer 308 as a function of position.

As shown in bar graph, the peak shift amount of oxygen vacancies in regions P2 that are proximate to the sharp corners, 311a and 311b, of the top electrode 312 is greater than the peak shift amount of oxygen vacancies in regions, P1 and P3, which are further from the sharp corners, 311a and 311b of the top electrode 312. For example, in regions P2, the peak shift amount of oxygen vacancies is approximately 1.5 nm, while in a center region P3 the peak shift is less than 0.5 nm and in edge regions P1 the peak shift is approximately 0 nm. Since the peak shift amount of oxygen vacancies is indicative of the ease by which conductive paths (e.g., comprising the oxygen vacancies) may be formed across the high-k dielectric data storage layer 308, the larger peak shift amount generated by near the sharp corners, 311a and 311b, of the top electrode 312 indicates that the sharp corners, 311a and 311b, of the top electrode 312 improves uniformity of operating parameters of the RRAM memory cell 300 (e.g., the stronger electric field will be able to change data states in spite of fabrication tolerances).

Figure 4:
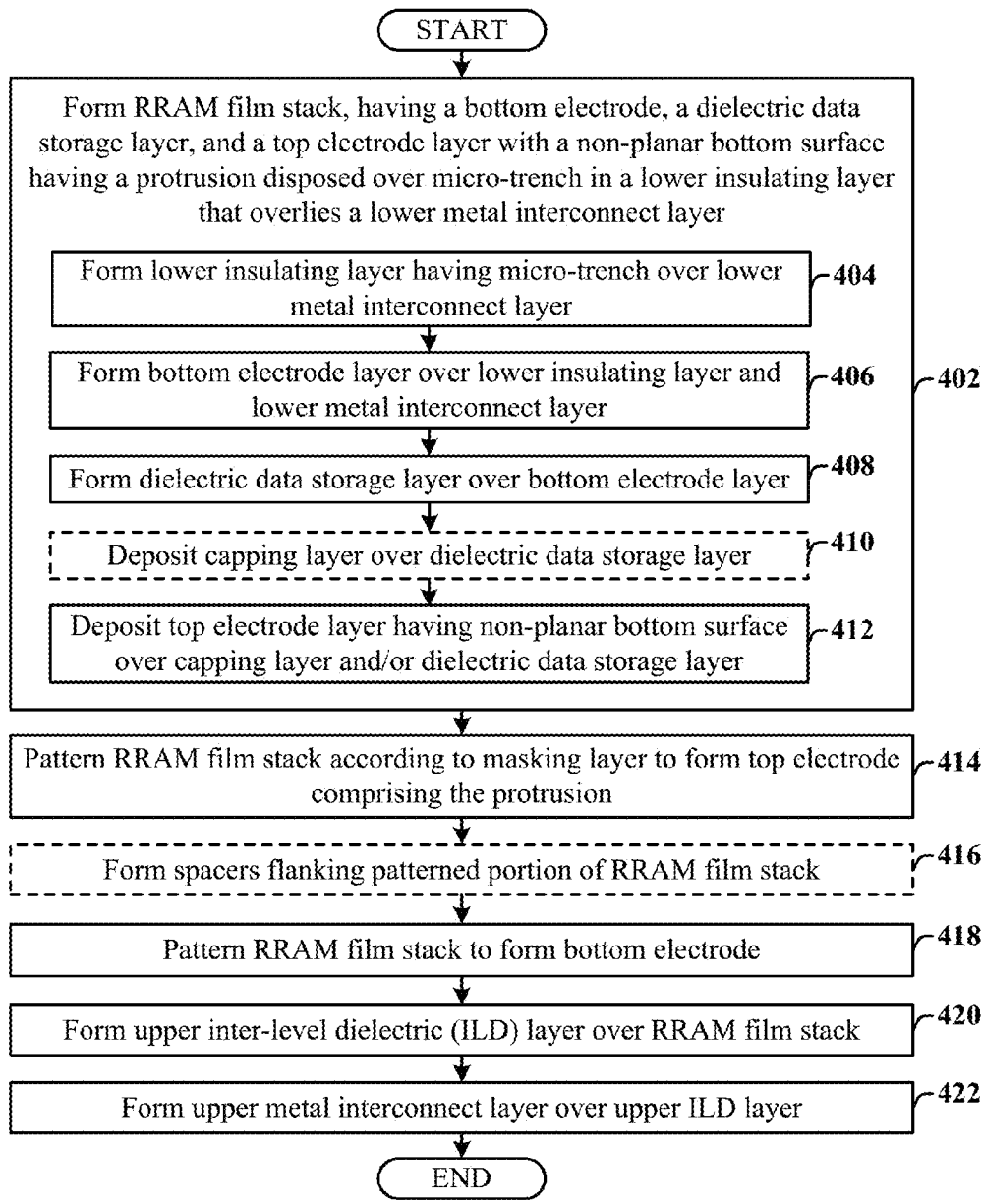
FIG. 4 illustrates a flow diagram of some embodiments of a method of forming an integrated chip including a RRAM memory cell comprising a top electrode having a bottom surface with a sharp tip geometry.

FIG. 4 illustrates a flow diagram of some embodiments of a method 400 of forming an integrated chip including an RRAM cell comprising a top electrode having a bottom surface with a sharp tip geometry.

While disclosed method 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, an RRAM (resistive random access memory) film stack, having a bottom electrode, a dielectric data storage layer, and a top electrode layer with a non-planar bottom surface, is formed over a lower metal interconnect layer. The non-planar bottom surface of the top electrode layer comprises one or more protrusions that extend outward from the non-planar bottom surface. In some embodiments, the RRAM film stack may be formed according to acts 404-412, as described below.

At 404, a lower insulating layer comprising a micro-trench is formed over a lower metal interconnect layer. The micro-trench extends through the lower insulating layer to form an opening (i.e., a micro-trench) that exposes the lower metal interconnect layer.

At 406, a bottom electrode layer is formed over the lower insulating layer and the lower metal interconnect layer. The bottom electrode layer fills in the micro-trench, so that the bottom electrode layer has a non-planar top surface with a depression overlying the micro-trench.

At 408, a dielectric data storage layer is formed over the bottom electrode layer.

At 410, a capping layer may be formed over the dielectric data storage layer, in some embodiments.

At 412, a top electrode layer is formed over the capping layer and/or the dielectric data storage layer. The non-planar top surface of the bottom electrode layer, causes the top electrode layer have a non-planar bottom surface with a protrusion that extends outward from the bottom surface.

At 414, the RRAM film stack is patterned according to a masking layer to define a top electrode. The top electrode has the non-planar bottom surface with the protrusion.

At 416, sidewall spacers may formed on opposing sides of the top electrode, in some embodiments.

At 418, the RRAM film stack is further patterned to form a bottom electrode.

At 420, an upper inter-level dielectric (ILD) layer is formed over the RRAM film stack. The upper ILD layer comprises an opening that defines a location of a top electrode via.

At 422, upper metal interconnect layer is formed over the upper ILD layer. The upper metal interconnect layer extends to a position in electrical contact with the top electrode.

FIGS. 5A-9 illustrate some embodiments of cross-sectional views showing a method of forming an RRAM cell comprising a top electrode having a bottom surface with a sharp tip geometry. Although FIGS. 5A-9 are described in relation to method 400, it will be appreciated that the structures disclosed in FIGS. 5A-9 are not limited to such a method, but instead may stand alone as structures independent of the method.

Figure 5A:
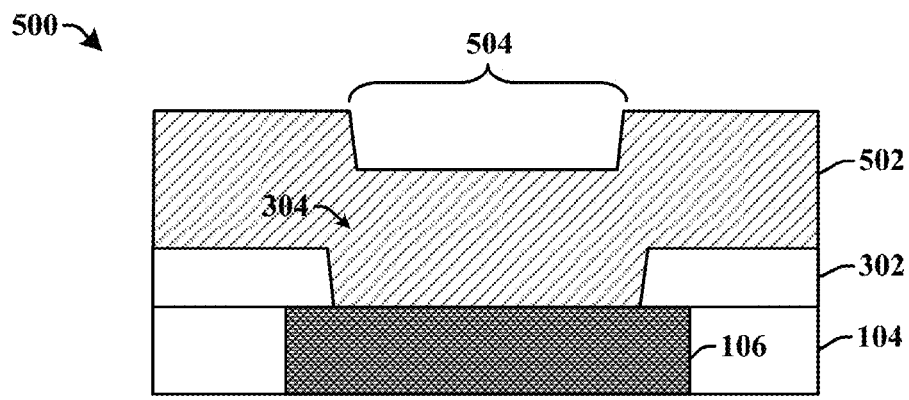
FIGS. 5A-9 illustrate some embodiments of cross-sectional views showing a method of forming an RRAM cell comprising a top electrode having a sharp tip geometry.
Figure 5B:
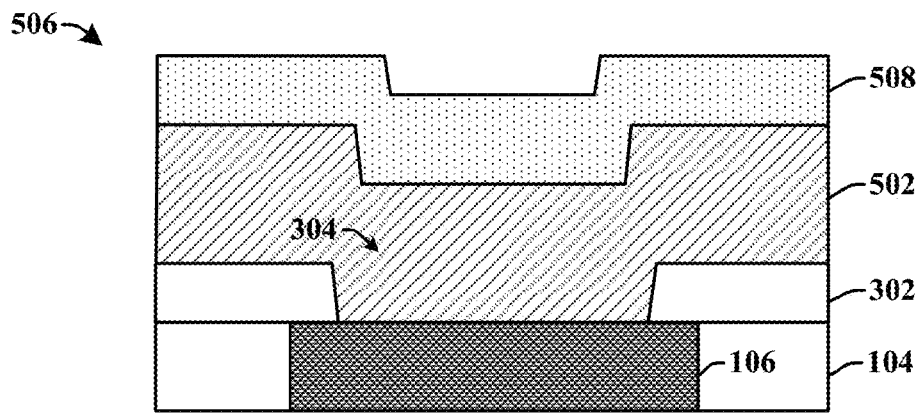
Figure 5C:
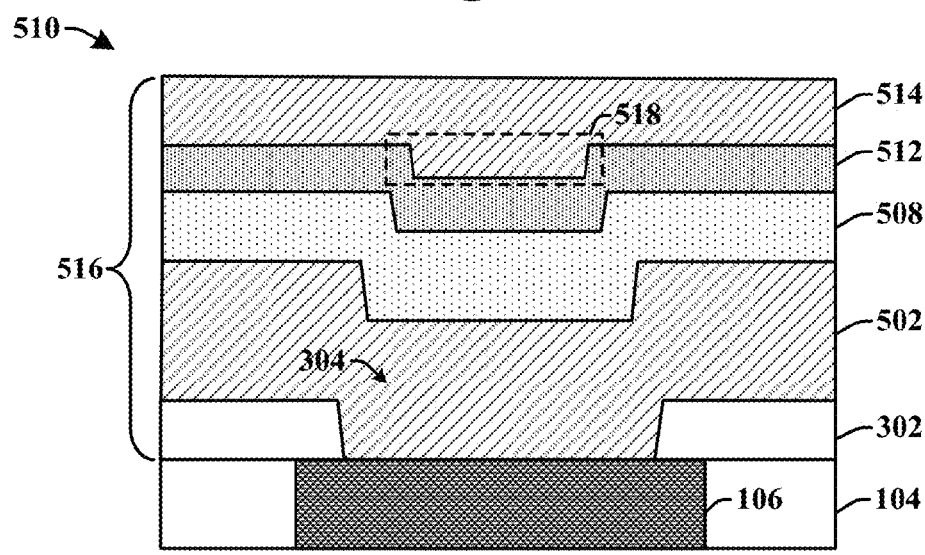

FIGS. 5A-5C illustrates some embodiments of cross-sectional views corresponding to acts 404-412.

FIG. 5A illustrates a cross-sectional view 500 corresponding to acts 404-406.

As shown in cross-sectional view 500, a lower metal interconnect layer 106 is formed within a lower inter-level dielectric (ILD) layer 104. In some embodiments, the lower metal interconnect layer 106 may be formed by selectively etching the lower ILD layer 104 (e.g., an oxide, a low-k dielectric, or an ultra low-k dielectric) to form an opening in the lower ILD layer 104. A metal (e.g., copper, aluminum, etc.) is then deposited to fill the opening, and a planarization process is performed to remove excess metal to form the lower metal interconnect layer 106.

A lower insulating layer 302 is subsequently formed onto the lower metal interconnect layer 106 and/or the lower ILD layer 104. In some embodiments, the lower insulating layer 302 may comprise silicon-nitride (SiN), silicon-carbide (SiC), or a similar composite dielectric film. In some embodiments, the lower insulating layer 302 may be formed by a vapor deposition technique (e.g., physical vapor deposition, chemical vapor deposition, etc.). The lower insulating layer 302 is then selectively etched (e.g., using a dry etchant) to form a cavity or micro-trench 304, which extends through the lower insulating layer 302 to the lower metal interconnect layer 106. In some embodiments, a diffusion barrier layer (not shown) may be formed over the lower metal interconnect layer 106 and the lower insulating layer 302. The diffusion barrier layer may be deposited into the micro-trench 304, so that the diffusion barrier layer abuts the lower metal interconnect layer 106.

A bottom electrode layer 502 is formed over the lower metal interconnect layer 106 and/or the lower ILD layer 104. The bottom electrode layer 502 extends from within the micro-trench 304 to a position overlying the lower insulating layer 302. The micro-trench 304 causes the bottom electrode layer 502 to have a non-planar topology that forms a cavity 504 in a top surface of the bottom electrode layer 502.

In some embodiments, the bottom electrode layer 502 may comprise one or more of tantalum (Ta), tantalum nitride (TaN), titanium (Ti), or titanium nitride (TiN), for example. In some embodiments, the bottom electrode layer 502 may be formed by way of a deposition process such as physical vapor deposition (PVD) or chemical vapor deposition (CVD). In some embodiments, a thickness of bottom electrode layer 502 may greater than approximately 300 Å (angstroms). In some embodiments, a thickness of the bottom electrode may be less than approximately 1200 Å for PVD, and approximately 600 Å for CVD.

FIG. 5B illustrates a cross-sectional view 506 corresponding to act 408.

As shown in cross-sectional view 506, a dielectric data storage layer 508 is formed over the bottom electrode layer 502. In various embodiments, the dielectric data storage layer 508 may be formed by way of a deposition process (e.g., PVD, CVD, PECVD, etc.). In some embodiments, the dielectric data storage layer 508 may comprise a hafnium oxide layer formed using an ALD process. For example, depositing a hafnium oxide ($HfO_2$) layer, may be performed by introducing hafnium tetrachloride ($HfCl_4$) precursor gas in a processing chamber to form a monolayer of $HfCl_4$, purging the hafnium tetrachloride ($HfCl_4$) precursor gas from the processing chamber, introducing a water ($H_2O$) precursor gas into the processing chamber, wherein the water precursor gas interacts with the monolayer of $HfCl_4$ to form a layer of $HfO_2$, and purging the water ($H_2O$) precursor gas from the processing chamber.

FIG. 5C illustrates a cross-sectional view 510 corresponding to acts 410-412.

As shown in cross-sectional view 510, a capping layer 512 may be formed onto the dielectric data storage layer 508. In some embodiments, the capping layer 512 may comprise a metal (e.g., titanium (Ti), hafnium (Hf), platinum (Pt), and/or aluminum (Al)) or a metal oxide (e.g., titanium oxide ($TiO_x$)), hafnium oxide ($HfO_x$), zirconium oxide ($ZrO_x$), germanium oxide ($GeO_x$), cesium oxide ($CeO_x$)).

A top electrode layer 514 is then formed over the capping layer 512 to form the RRAM film stack 516. Due to the non-planar topography of the micro-trench 304, the top electrode layer 514 has a non-planar bottom surface with a protrusion 518 overlying the micro-trench 304. In some embodiments, the top electrode layer 514 may comprise tantalum (Ta), or tantalum nitride (TaN), titanium (Ti), or titanium nitride (TiN), for example. In some embodiments, the top electrode layer 514 may be formed by way of a deposition process such as PVD, CVD, or ALD. It will be appreciate that the depth of the protrusion 518 may vary depending on a method of deposition. For example, when the top electrode layer 514 is deposited by a CVD process the depth of the protrusion 518 may be larger than when the top electrode layer 514 is deposited using a CVD process.

Figure 6A:
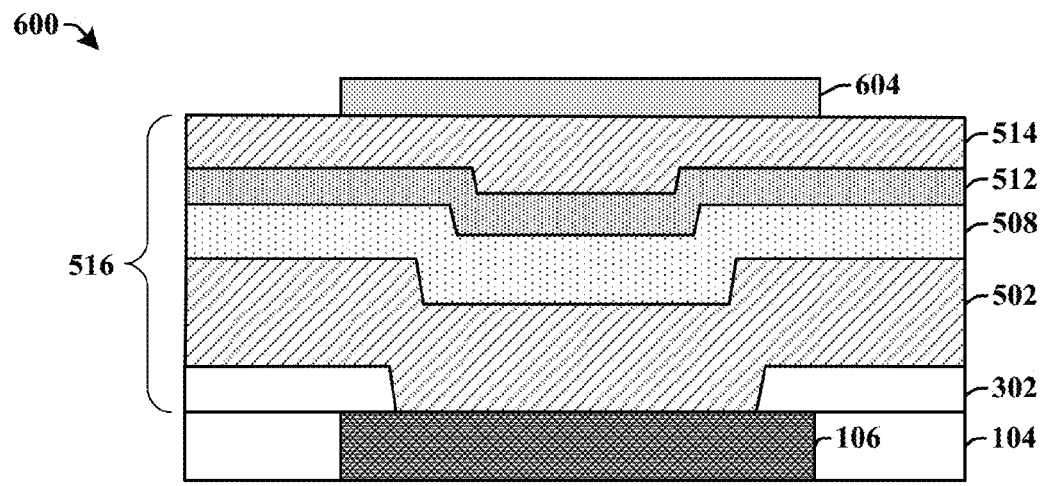
Figure 6B:
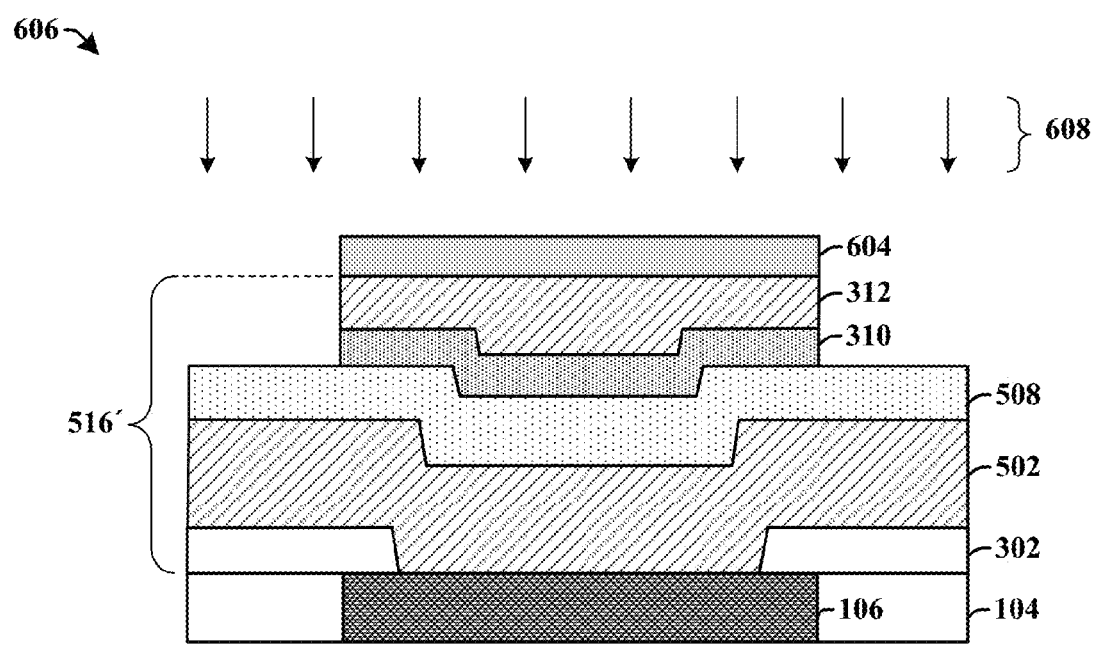

FIGS. 6A-6B illustrate some embodiments of cross-sectional views, 600 and 606, corresponding to act 414.

As shown in cross-sectional view 600, a masking layer 604 is formed onto the RRAM film stack 516 at a position defining a top electrode. The masking layer 604 may be formed directly onto the top electrode layer 514 using a deposition process (e.g., a vapor deposition process, a chemical vapor deposition process, etc.). In various embodiments, the masking layer 604 may comprise a silicon oxy-nitride (SiON) hard mask layer, a silicon dioxide ($SiO_2$) hard mask layer, or a PE-SiN hard mask.

As shown in cross-sectional view 606, the RRAM film stack 516 is patterned according to the masking layer 604 to define the top electrode 312. The RRAM film stack 602 may be patterned by selectively exposing the RRAM film stack 602 to an etchant 608 in areas not covered by the masking layer 604. In some embodiments, the etchant 608 may comprise a dry etchant configured to remove portions of the top electrode layer 514 and the capping layer 512.

Figure 7:
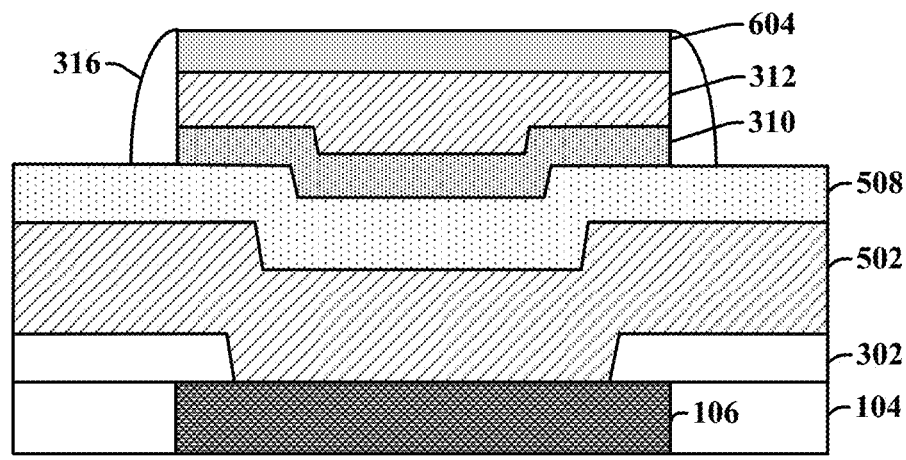

FIG. 7 illustrates some embodiments of a cross-sectional view 700 corresponding to act 416.

As shown in cross-sectional view 700, sidewall spacers 316 may be formed on opposing sides of the top electrode 312 and the capping layer 310, in some embodiments. In some embodiments, the sidewall spacers 316 may be formed by depositing nitride onto the dielectric data storage layer 508 and selectively etching the nitride to form the sidewall spacers 316.

Figure 8:
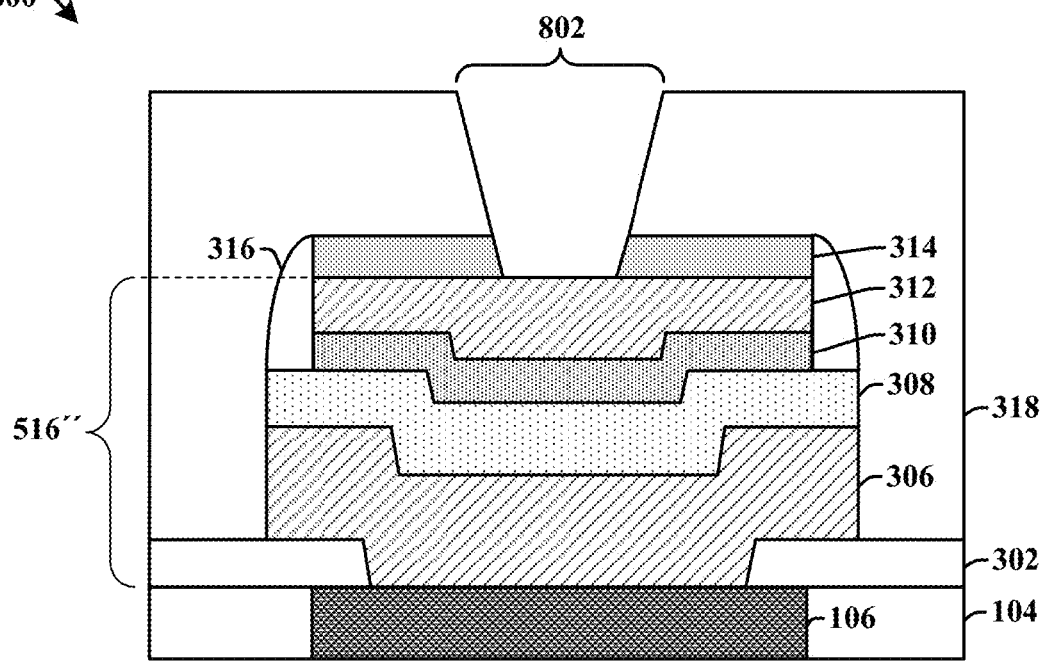

FIG. 8 illustrates some embodiments of a cross-sectional view 800 corresponding to acts 418-420.

As shown in cross-sectional view 800, the RRAM film stack 516' is further patterned according to the masking layer 604 and the sidewall spacers 316 to define a bottom electrode 306. The RRAM film stack 516' may be patterned by selectively exposing the RRAM film stack 516' to an etchant (e.g., a dry etchant) in areas not covered by the masking layer 604 and the sidewall spacers 316.

An upper inter-level dielectric (ILD) layer 318 is subsequently formed over patterned RRAM film stack 516". The upper ILD layer 318 may be patterned to form a via hole 802 for a via configured to contact the top electrode 312. In some embodiments, the via hole 802 may be formed by etching the upper ILD layer 318 to form an opening that extends from a top surface of the upper ILD layer 318 to a position abutting the top electrode 312.

Figure 9:
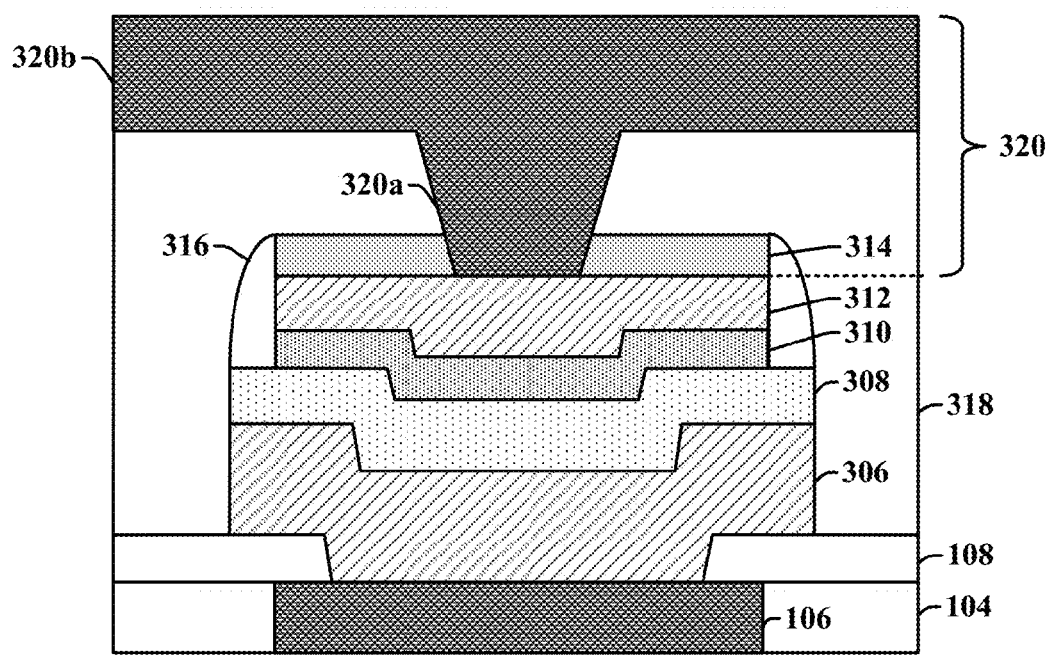

FIG. 9 illustrates some embodiments of a cross-sectional view 900 corresponding to act 522.

As shown in cross-sectional view 900, an upper metal interconnect layer 320 is formed at a position abutting the top electrode 312. In some embodiments, the upper metal interconnect layer 320 comprises an upper metal via 320a and an upper metal wire 320b. In some embodiments, the upper metal interconnect layer 320 may be formed by filing the via hole 802, and an overlying trench, with a metal (e.g., copper) to form an upper metal via 320a and the upper metal wire 320b, respectively.

Therefore, the present disclosure relates to an RRAM cell having a top electrode with a geometry configured to improve the electric performance of the RRAM cell, and an associated method of formation.

In some embodiments, the present disclosure relates to an RRAM (resistive random access memory) cell. The RRAM cell comprises a lower insulating layer having a micro-trench located over a lower metal interconnect layer disposed within an inter-level dielectric layer that overlies a semiconductor substrate. The RRAM cell further comprises a bottom electrode disposed over the micro-trench within the lower insulating layer, a dielectric data storage layer located over the bottom electrode, and a top electrode disposed over the dielectric data storage layer. The top electrode has a protrusion that extends outward from a bottom surface of the top electrode at a position overlying the micro-trench.

In other embodiments, the present disclosure relates to an RRAM cell. The RRAM cell comprises a lower insulating layer having a micro-trench located over a lower metal interconnect layer disposed within a lower inter-level dielectric (ILD) layer that overlies a semiconductor substrate. The RRAM cell comprises a bottom electrode disposed over the lower metal interconnect layer and the lower insulating layer, and having a top surface comprising a depression laterally aligned with the micro-trench. The RRAM cell further comprises a high-k dielectric layer continually abutting the top surface of bottom electrode, and a top electrode disposed over the high-k dielectric data storage layer. The top electrode has a protrusion that extends outward from a non-planar bottom surface of the top electrode at a position overlying the micro-trench, wherein the protrusion comprises one or more sharp corners disposed between adjacent edges having different slopes.

In yet other embodiments, the present disclosure relates to a method of forming an RRAM cell. The method comprises forming an RRAM film stack having a bottom electrode layer, a dielectric data storage layer, and a top electrode layer. The top electrode layer has a non-planar bottom surface having a protrusion disposed over a micro-trench in an underlying lower insulating layer that overlies a lower metal interconnect layer. The method further comprises patterning the RRAM film stack according to one or more masking layers to form a top electrode having the protrusion. The method further comprises forming an upper metal interconnect layer at a position electrically contacting the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An RRAM (resistive random access memory) cell, comprising:
   a lower insulating layer having a micro-trench located over a lower metal interconnect layer disposed within a lower inter-level dielectric (ILD) layer that overlies a semiconductor substrate;
   a bottom electrode disposed over the micro-trench;
   a dielectric data storage layer located over the bottom electrode; and
   a top electrode disposed over the dielectric data storage layer, wherein the top electrode has a protrusion that extends outward from a bottom surface of the top electrode at a position overlying the micro-trench.

2. The RRAM cell of claim 1, wherein the bottom electrode vertically extends to a position within the micro-trench.

3. The RRAM cell of claim 1, wherein the protrusion comprises one or more sharp corners disposed between adjacent edges having different slopes.

4. The RRAM cell of claim 1, wherein the protrusion comprises a nadir that separates two concave edges of the top electrode.

5. The RRAM cell of claim 1, wherein the protrusion has a nadir that is aligned with a center of the micro-trench.

6. The RRAM cell of claim 1,
   wherein a bottom surface of the dielectric data storage layer continually abuts a top surface of the bottom electrode, and
   wherein the bottom surface of the top electrode continually abuts a top surface of the dielectric data storage layer.

7. The RRAM cell of claim 1, wherein a top surface of the top electrode dips to a point that is vertically disposed below upper outer corners of the top surface of the top electrode.

8. An RRAM (resistive random access memory) cell, comprising:
   a lower insulating layer having a micro-trench located over a lower metal interconnect layer disposed within a lower inter-level dielectric (ILD) layer that overlies a semiconductor substrate;
   a bottom electrode disposed over the lower metal interconnect layer and the lower insulating layer, and having a top surface comprising a depression overlying the micro-trench;
   a high-k dielectric data storage layer continually abutting the top surface of the bottom electrode, wherein the high-k dielectric data storage layer has a first protrusion that extends outward from a bottom surface of the high-k dielectric data storage layer to a position laterally surrounded by the bottom electrode; and
   a top electrode disposed over the high-k dielectric data storage layer, which has a second protrusion that extends outward from a bottom surface of the top electrode at a position overlying the micro-trench, wherein the second protrusion comprises one or more sharp corners disposed between adjacent edges having different slopes.

9. The RRAM cell of claim 8, wherein the first protrusion and the second protrusion each have a shape that is symmetric with respect to a center of the micro-trench.

10. The RRAM cell of claim 8, wherein a top surface of the top electrode dips to a point that is vertically disposed below upper outer corners of the top surface of the top electrode.

11. A method of forming an RRAM cell, comprising:
   forming an RRAM film stack having a bottom electrode layer, a dielectric data storage layer, and a top electrode layer, wherein the top electrode layer has a non-planar bottom surface having a protrusion disposed over a micro-trench in an underlying lower insulating layer that overlies a lower metal interconnect layer;
   patterning the RRAM film stack according to one or more masking layers to form a top electrode having the protrusion; and
   forming an upper metal interconnect layer at a position electrically contacting the top electrode.

12. The method of claim 11, further comprising:
   forming the lower insulating layer having the micro-trench located over the lower metal interconnect layer disposed within a lower inter-level dielectric (ILD) layer that overlies a semiconductor substrate;
   forming the bottom electrode layer over the lower insulating layer and the lower metal interconnect layer;
   forming the dielectric data storage layer onto the bottom electrode layer; and forming the top electrode layer having the protrusion overlying the micro-trench.

13. The method of claim 12,
wherein a bottom surface of the dielectric data storage layer continually abuts a top surface of the bottom electrode, and
wherein the non-planar bottom surface of the top electrode continually abuts a top surface of the dielectric data storage layer.

14. The method of claim 11, wherein the protrusion has a shape that is symmetric with respect to a center of the micro-trench.

15. The method of claim 11, wherein protrusion causes a top surface of the top electrode to dip to a point that is vertically disposed below upper outer corners of the top surface of the top electrode.

16. The RRAM cell of claim 1, wherein the lower insulating layer has curved sidewalls.

17. The RRAM cell of claim 1, wherein the bottom electrode comprises has a second protrusion that extends outward from a bottom surface of the bottom electrode at a position underlying the protrusion.

18. The RRAM cell of claim 8, wherein the lower metal interconnect layer has tapered sidewalls, such that the insulating layer is arranged onto a top width of the lower metal interconnect layer that is larger than a bottom width of the lower metal interconnect.

19. The RRAM cell of claim 8, wherein the second protrusion comprises a tip arranged between two curved lower surfaces of the high-k dielectric data storage layer.

20. The RRAM cell of claim 8, wherein the top electrode has sidewalls that are laterally set back from sidewalls of the high-k dielectric data storage layer.

* * * * *